United States Patent
Chiola

(10) Patent No.: US 6,977,208 B2
(45) Date of Patent: Dec. 20, 2005

(54) SCHOTTKY WITH THICK TRENCH BOTTOM AND TERMINATION OXIDE AND PROCESS FOR MANUFACTURE

(75) Inventor: Davide Chiola, Marina del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/766,460

(22) Filed: Jan. 27, 2004

(65) Prior Publication Data

US 2005/0161758 A1  Jul. 28, 2005

(51) Int. Cl.[7] ............................................. H01L 21/28
(52) U.S. Cl. ...................... 438/570; 438/571; 257/471; 257/594
(58) Field of Search ................................ 438/570, 571, 438/582, 981; 148/DIG. 139, DIG. 140; 257/281, 284, 471, 483, 594

(56) References Cited

U.S. PATENT DOCUMENTS

| 4,941,026 | A  | * | 7/1990 | Temple ........................ 257/333 |
| 6,441,454 | B2 | * | 8/2002 | Hijzen et al. ................ 257/483 |
| 6,707,127 | B1 | * | 3/2004 | Hshieh et al. ............... 257/483 |
| 2005/0062124 | A1 | * | 3/2005 | Chiola ......................... 257/476 |
| 2005/0127465 | A1 | * | 6/2005 | Chiola ......................... 257/471 |

* cited by examiner

Primary Examiner—Trung Dang
(74) Attorney, Agent, or Firm—Ostrolenk, Faber, Gerb & Soffen, LLP

(57) ABSTRACT

A trench schottky diode which includes a thin insulation layer on the sidewalls of its trenches and a relatively thicker insulation layer at the bottoms of its trenches.

16 Claims, 6 Drawing Sheets

SCHOTTKY WITH THICK TRENCH BOTTOM AND TERMINATION OXIDE AND PROCESS FOR MANUFACTURE

BACKGROUND OF THE INVENTION

Trench schottky diodes are known. FIG. 1 shows the cross-section of a portion of a trench schottky which is described in the copending U.S. patent application Ser. No. 10/193,783 assigned to the assignee of the present application.

The trench schottky diode shown in FIG. 1 is formed in an epitaxial silicon layer 10 of one conductivity which is formed over a silicon substrate 12 of the same conductivity. Epitaxial layer 10 includes a lower concentration of dopants than substrate 12. Typically, the epitaxial layer 10 and substrate 12 are doped with N-type dopants.

The trench schottky diode shown in FIG. 1 includes a plurality of spaced trenches 14 which extend from the top surface of epitaxial layer 10 to a predetermined depth. Each trench 14 is lined with an oxide layer 16 at its bottom and sidewalls of a substantially uniform thickness of typically about 500 Å to 750 Å, and includes in its interior an electrode 18 formed of a conductive material such as doped polysilicon.

As seen in FIG. 1, between each pair of trenches 14 a mesa 20 is formed. A schottky barrier layer 22 is formed such that it is in schottky contact with mesas 20 and electrical contact with electrodes 18 inside trenches 14. Schottky barrier layer 22 may be formed from, for example, titanium or titanium tungsten. An anode contact 24 which is preferably formed from aluminum is formed over schottky barrier layer 22. The trench schottky diode shown by FIG. 1 also includes cathode contact 26 formed over substrate 12. Cathode contact 26 may be a solderable contact structure such as a trimetal structure.

The trench schottky diode shown by FIG. 1 also includes termination trench 28 which surrounds the active region of the device. The sidewalls and the bottom of termination trench 28 are also lined with an oxide layer 16. Anode contact 24 extends over the inner sidewall of termination trench 28 and to a portion of the bottom thereof. Also formed at the inner and outer sidewalls of termination trench 28 are conductive polysilicon walls 30. Anode contact 24 may be capacitively connected with epitaxial layer 10 adjacent the inner sidewall of termination trench 28 through polysilicon wall 30. The outer boundary of the trench schottky diode is shown by scribe line 32. FIG. 1 also shows typical dimensional values for the prior art trench schottky diode.

In a device shown by FIG. 1, when oxide layer 16 is kept at or near 500 Å the device exhibits desirable reverse voltage blocking characteristics for a voltage rating of 15 to 20V. However, thin oxide layers are more prone to oxide breakdown under high reverse voltage conditions and to mechanical fracture of points of high stress, like at the edge of metal field plate. To remedy the problem oxide layer 16 can be thickened to up to about 1200 Å. A trench schottky diode with a thicker oxide layer 16, however, exhibits a higher leakage current, which is undesirable.

SUMMARY OF THE INVENTION

A trench schottky diode according to the present invention includes an oxide layer at the bottom surface of its trenches and relatively thinner oxide layers at the sidewalls of its trenches. The thin oxide layers at the sidewalls of the trenches enable the device to exhibit desirable reverse leakage characteristics, while the thick oxide at the bottom of the trenches improves the ability of the oxide to withstand breakdown under high reverse voltage conditions, and the ruggedness of the field oxide in high stress points.

In the preferred embodiment of the present invention the oxide on the sidewalls of the trenches is 500–750 Å thick, while the oxide at the bottom of the trenches is between 1000–5000 Å thick.

According to another aspect of the present invention, the device according to the present invention includes a termination trench which extends around the trenches in the active area of the device and include a thin oxide layer on a sidewall thereof closest to the active region and a thick oxide layer that extends at least partially along its bottom wall.

According to another aspect of the present invention, the thick oxide at the bottom of the trenches is grown while the sidewalls of the trenches are covered by an oxidation preventing layer such as a layer of nitride.

According to another aspect of the present invention, the oxidation preventing layer on the sidewalls of the trenches is formed by first depositing a layer of oxidation preventing material over the sidewalls and the bottoms of the trenches and then dry etching the oxidation preventing material from the bottom of the trenches prior to growing a thick layer of oxide at the bottom of the trenches.

Other features and advantages of the present invention will become apparent from the following description of the invention which refers to the accompanying drawings.

DETAILED DESCRIPTION OF THE FIGURES

Figure 1:
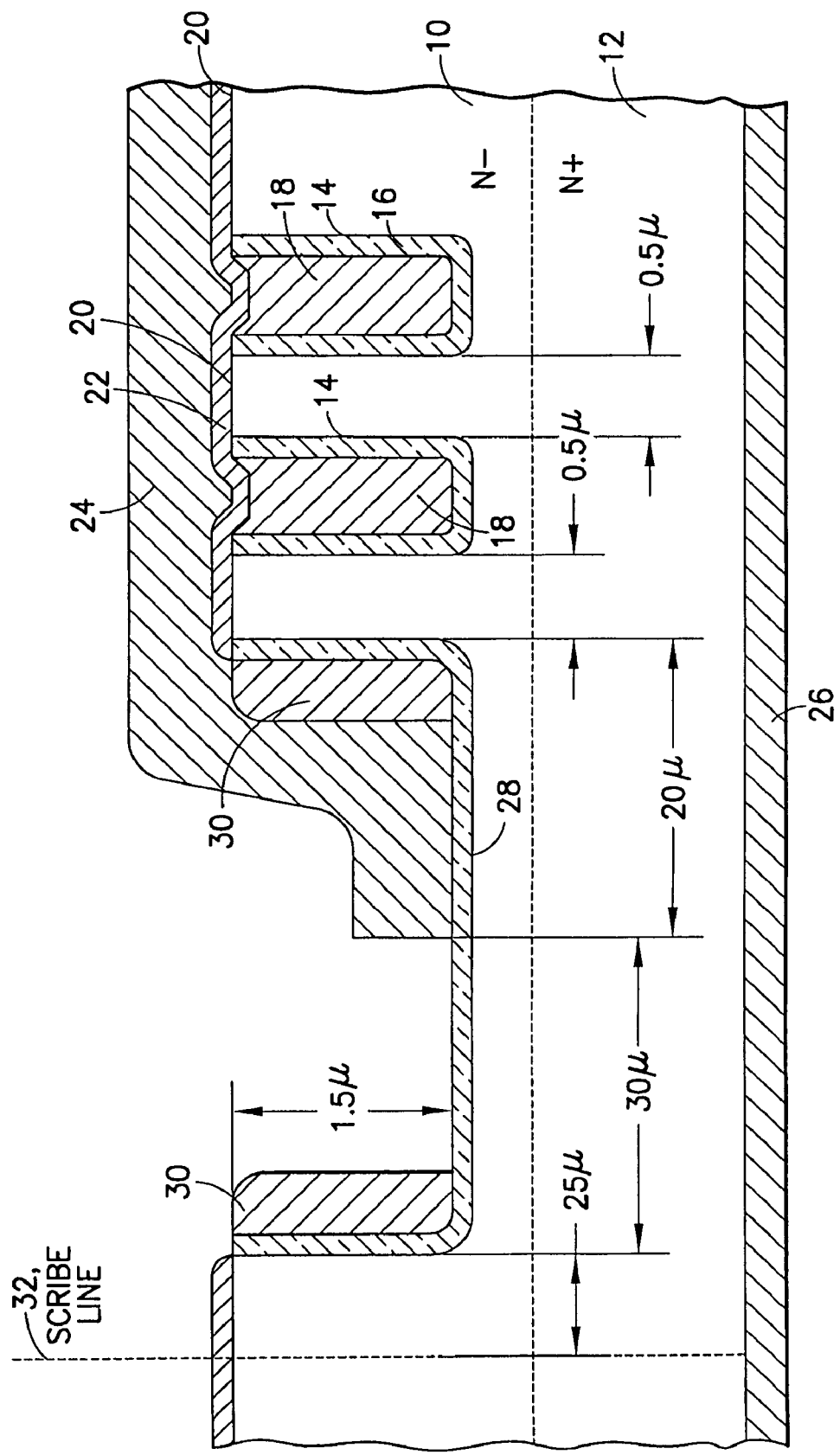
FIG. 1 shows a cross-section of a trench schottky diode according to the prior art.
Figure 2A:
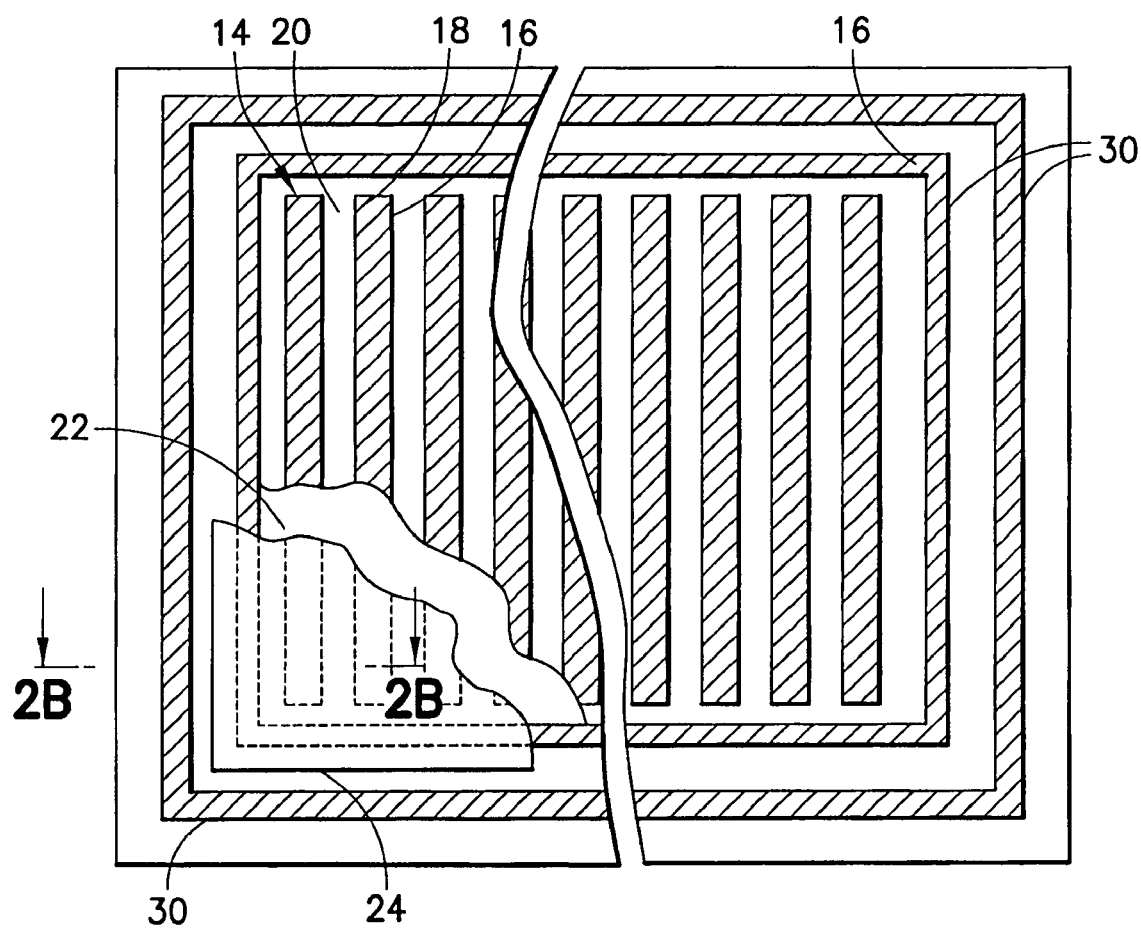
FIG. 2A shows a top plan view of a trench schottky diode according to the present invention.
Figure 2B:
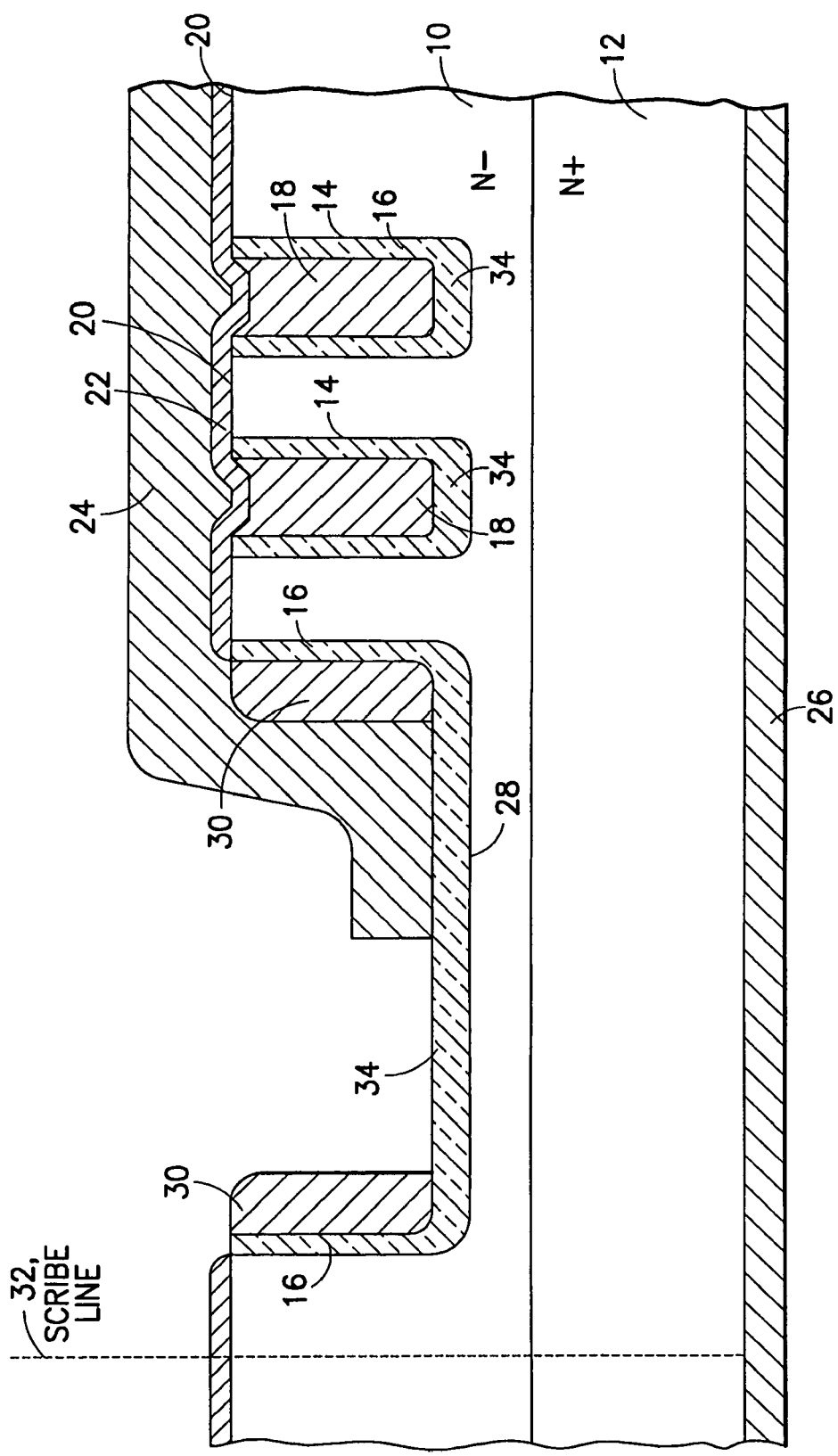
FIG. 2B shows a cross-sectional view of a trench schottky diode according to the present invention along line 2B—2B in FIG. 2A, viewed in the direction of the arrows.

Referring to FIG. 2A and FIG. 2B, a trench schottky diode according to the present invention includes all of the features of a prior art trench schottky diode (see FIG. 1) except that, unlike the prior art trench schottky diode of FIG. 1, a trench schottky diode according to the present invention includes thick oxide layer 34 formed on the bottom surface of trenches 14 and termination trench 28. Thick oxide layer 34 may be 1000–5000 Å thick.

Referring now to FIGS. 3A–3H, a process for manufacturing a trench schottky diode according to the present invention will be described.

Figure 3A:
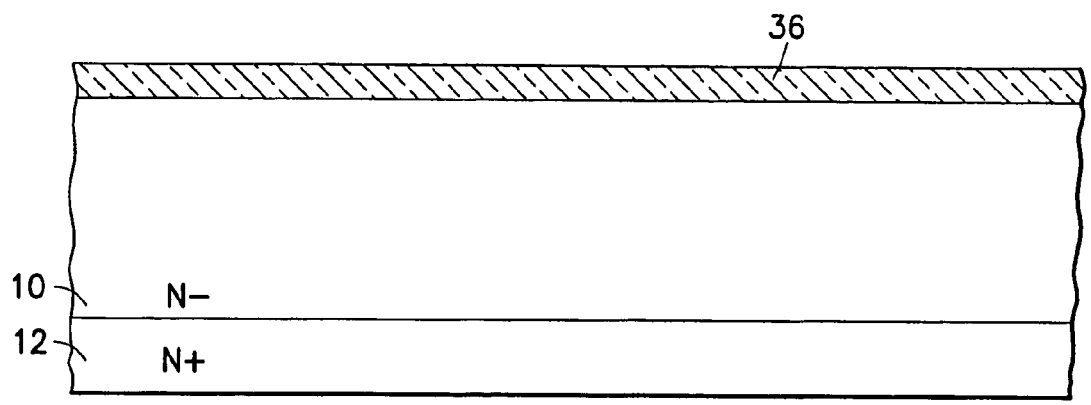
FIGS. 3A–3H illustrate a method for manufacturing a trench schottky device according to the present invention.

Referring first to FIG. 3A, a preferably 600 Å–800 Å thick layer of Silicon Nitride 36 is formed over epitaxial silicon layer 10. Epitaxial silicon layer 10 is formed over silicon substrate 12 which includes dopants of the same conductivity as the dopants in epitaxial silicon layer 10, but of higher concentration. In the preferred embodiment of the present invention, epitaxial silicon layer 10 and substrate 12 are doped with N-type dopants.

Figure 3B:
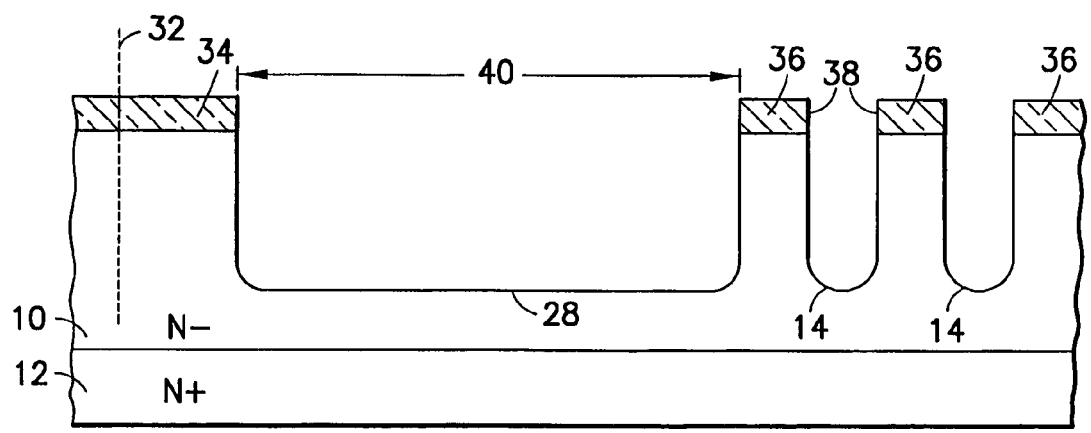

Next, through a photolithographic step windows 38, 40 are defined in the layer of silicon nitride 36, and trenches 14 and termination trench 28 are formed by anisotropically etching epitaxial layer 10 below windows 38, 40 to form trenches 14 and termination trench 28 respectively as shown by FIG. 3B.

Figure 3C:
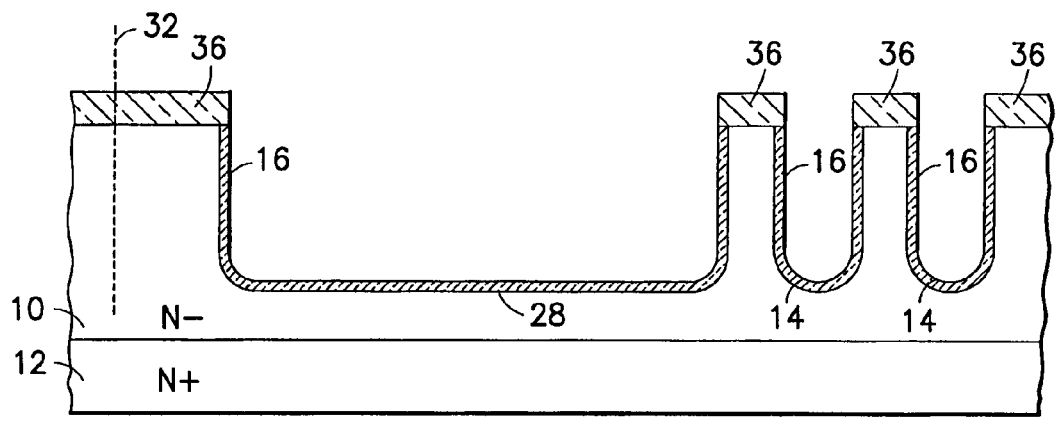

Referring next to FIG. 3C, a preferably 1000–1300 Å thick layer of sacrificial oxide 16 is formed over the sidewalls and bottom of trenches 14 and termination trench 28. Next, the sacrificial oxide is removed by wet etch. Then the gate oxide is grown to a thickness of 500–750 Å over the sidewalls and bottom of trenches 14 and termination trench 28. Thus, silicon nitride 36 having openings therein acts as both a mask for forming trenches 14 and termination trench 28, and for forming oxide 16 over the sidewalls of trenches 14 and termination trench 28. Preferably, oxide 16 layer is grown through oxidation of sidewalls of trenches 14 in a well known oxidation step.

Figure 3D:
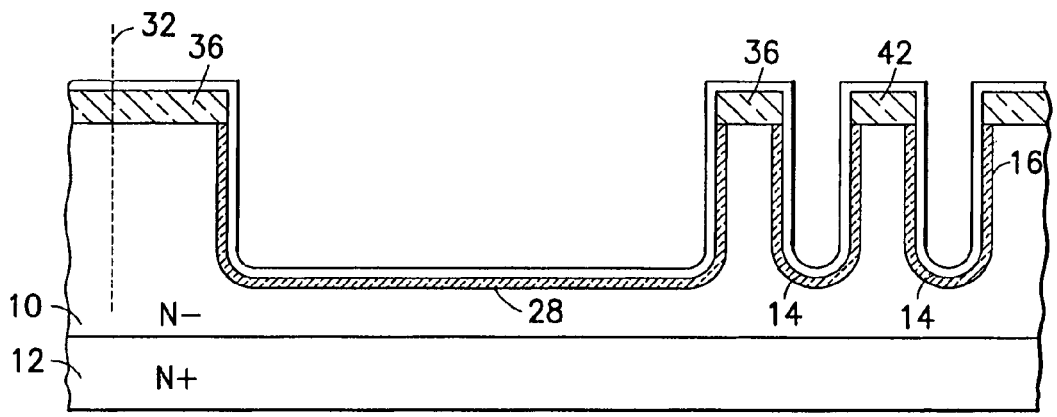
Figure 3E:
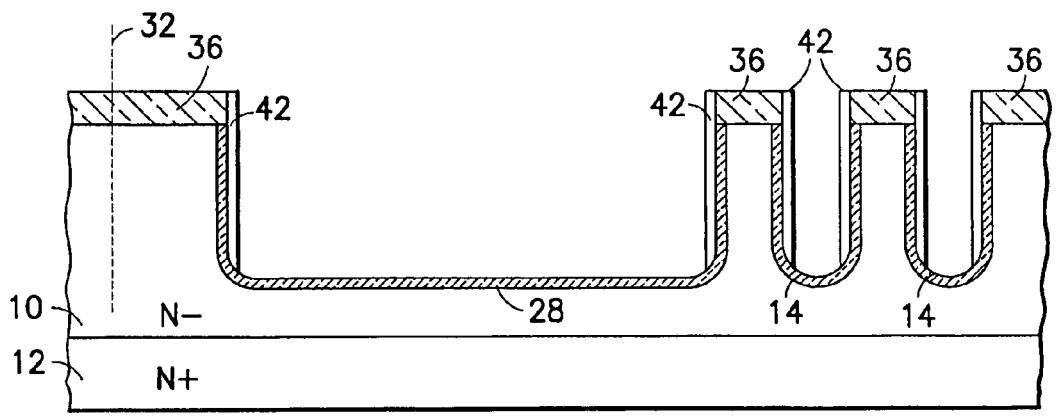

Thereafter, as shown by FIG. 3D, a preferably 150–200 Å thick layer of nitride 42 is deposited over the structure shown by FIG. 3C, and through dry nitride etching nitride 42 is removed from the bottom of trenches 14 and termination trench 28 leaving nitride 42 walls on the sidewalls of trenches 14 and termination trench 28 as shown by FIG. 3E.

Figure 3F:
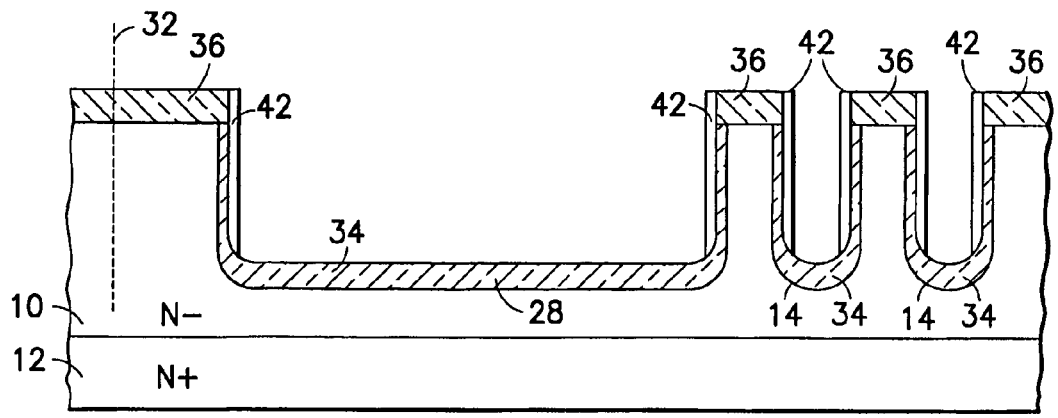

A preferably 1000–5000 Å thick oxide layer 34 is then formed at the bottom of trenches 14 and termination trench 28 as shown by FIG. 3F, and then walls of nitride 42 on the sidewalls of termination trench 28 and trench 14, and portions of silicon nitride 36 from the top surface of epitaxial layer 10 are removed by a wet etch. The target wet etch at this step is preferably between 200–250 Å. Preferably, thick oxide layer 34 is formed by low temperature oxidation in a well known oxidation step.

Figure 3G:
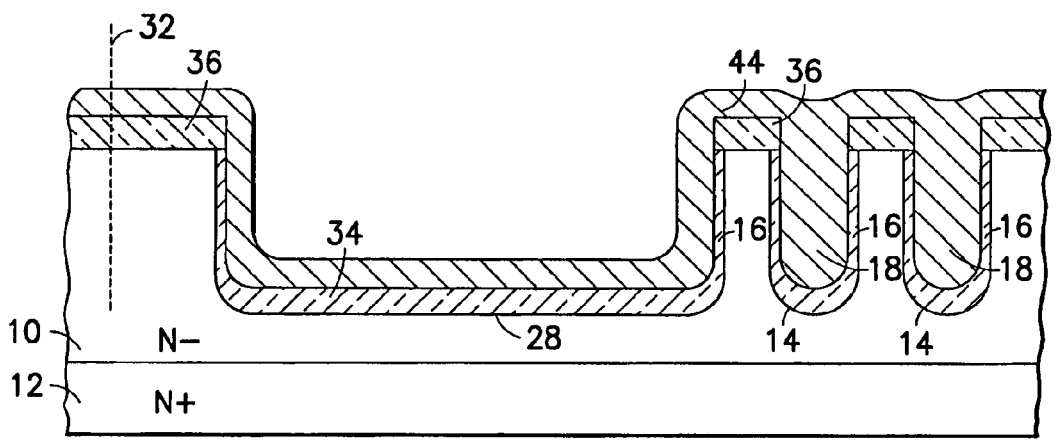
Figure 3H:
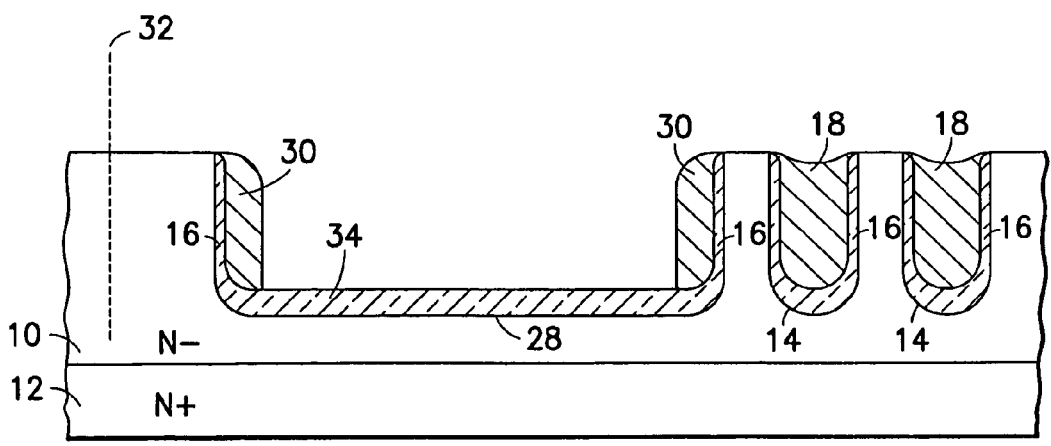

Next, as shown by FIG. 3G, a layer of polysilicon 44 is deposited over the structure shown by FIG. 3F. Boron atoms are then implanted into the layer of polysilicon 44 and driven in a thermal step. Subsequently, the layer of polysilicon 44 is anisotropically etched leaving electrodes 18 in trenches 14 and polysilicon on the inner and outer sidewalls of termination trench 28. The remaining portions of nitride 36 is then removed by wet nitride etching to obtain the structure shown by FIG. 3H.

Next, the top surface of epitaxial layer 10 is cleaned by a suitable pre-metal cleaning step not containing HF. A layer of a schottky barrier metal, such as titanium, or titanium-tungsten (TiW), etc. is next formed on the top surface of epitaxial layer 10 at a thickness of approximately 600 Å. Any technique can be used for formation of the layer of schottky barrier; sputtering and electron beam evaporation are the most common techniques.

If titanium is used, preferably, a 600 Å layer of titanium is sputtered and annealed at a high temperature in an inert atmosphere. As a consequence, the thin titanium layer reacts with the epitaxial silicon 10 to form a titanium silicide layer over the active region, thereby forming schottky barrier 22 over the top of mesas 20. The non-reacted titanium layer extending along the termination trench 28 may then be removed by etching with any known Ammonium Hydroxide and Hydrogen Peroxide-based solution. Etch time can vary, but etch temperature should not exceed 80° C. to avoid excessively fast decomposition of the $H_2O_2$.

Anode contact 24, which may be a layer of aluminum or other conductive metal layer is next deposited. A metal mask (not shown) is applied for further etching to remove partly a peripheral portion of the anode contact within the termination trench 28 leaving a portion of the bottom of termination trench 28 covered by anode contact 24. Trimetal Ti/Ni/Ag is then sputtered on substrate 12 to form cathode contact 26, thus obtaining a trench schottky diode as shown by FIGS. 2A and 2B. One skilled in the art would recognize that a plurality of trench schottky diodes according to the present invention may be formed in a wafer and then singulated by dicing along scribe line 32 to obtain individual trench schottky diodes according to the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A schottky device comprising;
   a semiconductive substrate of a first conductivity type and a first concentration of dopants;
   a semiconductive layer of said first conductivity type and a second concentration of dopants, said first concentration of dopants being higher than said second concentration of dopants;
   a plurality of trenches extending to a depth inside said semiconductive layer, each of said trenches including opposing sidewalls and a bottom, and each being adjacent at least one mesa, each mesa being of said first conductivity only;
   a first insulation layer of a first thickness on each sidewall of each of said trenches;
   a second insulation layer of a second thickness on said bottom of each of said trenches, said second thickness being greater than said first thickness, said second insulation layer terminating at and extending along said bottom of each said trenches only, and said first insulation extending along the remainder of said sidewall;
   an electrode disposed in each of said trenches;
   a termination trench of the same depth as said plurality of trenches surrounding said plurality of said trenches, said termination trench including a bottom portion, and an inner sidewall, said inner sidewall being a sidewall of a mesa of only said first conductivity;
   an insulation layer of a same thickness as a first insulation layer disposed on at least said inner sidewall of said termination trench, an electrode on said insulation layer disposed on at least said inner sidewall, and an insulation layer disposed on said bottom portion of said termination trench, said insulation layer on said bottom portion being thicker than said insulation layer on said inner sidewall of said trench;
   a schottky barrier in schottky contact with said mesas;
   a first electrical contact in contact with said schottky barrier, said electrodes in said trenches, and a surface of said electrode on said insulation layer opposite said inner sidewall of said termination trench; and
   a second electrical contact in electrical contact with said semiconductive substrate.

2. A schottky device according to claim 1, wherein said first insulation layer is grown on each sidewall of each of said trenches, and said second insulation is grown on said bottom of each of said trenches.

3. A schottky device according to claim 1, wherein said electrode is comprised of conductive polysilicon.

4. A schottky device according to claim 1, wherein said semiconductive layer and said semiconductive substrate are comprised of silicon.

5. A schottky device according to claim 1, wherein said semiconductive layer is an epitaxial layer.

6. A schottky device according to claim 1, wherein said first insulation layer is between 500–750 Å.

7. A schottky device according to claim 1, wherein said second insulation layer is between 1000–5000 Å.

8. A schottky device according to claim 1, wherein said schottky barrier is comprised of one of platinum, platinum silicide and platinum tungsten.

9. A schottky device according to claim 1, wherein said first insulation layer is oxide that is grown on said sidewalls of each of said trenches, and said second insulation is oxide that is deposited at the bottom of each of said trenches.

10. A method for manufacturing a schottky device comprising:

providing a semiconductive body of one conductivity;

forming a plurality of trenches in said semiconductive body in a single step, each trench having opposing sidewalls, and a bottom, and each being adjacent a mesa, each mesa being of said one conductivity only;

forming an oxide layer on said sidewalls of said trenches;

covering said sidewalls of said trenches with an oxidation preventing layer;

forming an oxide layer at the bottom of each of said trenches, said oxide layer at said sidewalls of said trenches being thinner than said oxide layer at said bottom of said trenches;

forming a schottky barrier layer in schottky contact with each of said mesas;

forming electrodes in each of said trenches;

forming a termination trench of a same depth as said plurality of trenches around said plurality of trenches, said termination trench including a sidewall, and a bottom surface, said sidewall of said termination trench being a sidewall of a mesa of only said one conductivity;

forming an oxide layer of a first thickness on said sidewall of said termination trench, and an oxide layer of a second thickness on said bottom surface, said second thickness being thicker than said first thickness, and said first thickness being the same thickness as said oxide layer on said sidewalls of said trenches;

forming an electrode on said oxide layer of said first thickness; and forming a contact in contact with said schottky barrier layer, said electrodes in said trenches, and a surface of said electrode on said oxide layer of said first thickness opposite said inner sidewall of said termination trench.

11. A method according to claim 10, further comprising forming another oxidation preventing layer on a major surface of said semiconductive layer, forming a plurality of openings in said oxidation preventing layer and forming said plurality of trenches by etching said semiconductive layer at bottoms of said openings.

12. A method according to claim 10, further comprising forming a termination trench around said plurality of trenches.

13. A method according to claim 11, further comprising forming an opening in said another oxidation preventing layer surrounding said plurality of openings and etching said semiconductive layer at the bottom of said opening surrounding said plurality of openings to form a termination trench.

14. A method according to claim 11, wherein said oxidation preventing layer and said another oxidation preventing layer are comprised of a nitride.

15. A method according to claim 10, further comprising forming a layer of oxidation preventing layer over said sidewalls and said bottoms of said trenches and etching said oxidation preventing layer from said bottoms of said trenches to cover said sidewalls of said trenches with an oxidation preventing layer.

16. A method according to claim 15, wherein said oxidation preventing layer is comprised of a nitride.

* * * * *